US010838437B2

(12) United States Patent
Penley et al.

(10) Patent No.: US 10,838,437 B2
(45) Date of Patent: Nov. 17, 2020

(54) APPARATUS FOR SPLITTING FLOW OF PROCESS GAS AND METHOD OF OPERATING SAME

(71) Applicant: Reno Technologies, Inc., Wilmington, DE (US)

(72) Inventors: Sean Penley, Sparks, NV (US); Marshall B Grill, Reno, NV (US)

(73) Assignee: ICHOR SYSTEMS, INC., Fremont, CA (US)

( * ) Notice: Subject to any disclaimer, the term of this patent is extended or adjusted under 35 U.S.C. 154(b) by 39 days.

(21) Appl. No.: 16/282,737

(22) Filed: Feb. 22, 2019

(65) Prior Publication Data

US 2019/0258279 A1   Aug. 22, 2019

Related U.S. Application Data

(60) Provisional application No. 62/633,945, filed on Feb. 22, 2018.

(51) Int. Cl.
| | |
|---|---|
| *G05D 11/13* | (2006.01) |
| *H01L 21/67* | (2006.01) |
| *H04W 64/00* | (2009.01) |
| *H04W 4/02* | (2018.01) |
| *F16K 1/00* | (2006.01) |

(52) U.S. Cl.
CPC ............... *G05D 11/13* (2013.01); *F16K 1/00* (2013.01); *H01L 21/67017* (2013.01); *H04W 4/023* (2013.01); *H04W 64/00* (2013.01)

(58) Field of Classification Search
USPC ........................................................ 73/1.16
See application file for complete search history.

(56) References Cited

U.S. PATENT DOCUMENTS

| | | | | |
|---|---|---|---|---|
| 2,615,659 | A | * | 10/1952 | Gardner, Jr. ............. B64C 1/32 244/121 |
| 2,666,297 | A | | 1/1954 | Skousgaard |
| 3,271,994 | A | | 9/1966 | Fournier et al. |
| 3,335,748 | A | | 8/1967 | Klemm et al. |
| 3,453,861 | A | | 7/1969 | Levasseur |
| 3,491,946 | A | | 1/1970 | Muller |

(Continued)

FOREIGN PATENT DOCUMENTS

| | | |
|---|---|---|
| CN | 1461429 A | 12/2003 |
| CN | 1816733 | 8/2006 |

(Continued)

*Primary Examiner* — Clayton E. LaBalle
*Assistant Examiner* — Warren K Fenwick
(74) *Attorney, Agent, or Firm* — The Belles Group, P.C.

(57) ABSTRACT

Apparatuses for controlling gas flow are important components for delivering process gases for semiconductor fabrication. In one embodiment, an apparatus for controlling gas flow is disclosed, the apparatus delivering two gas flows at a known ratio. Specifically, the apparatus has first and second on/off valves and first and second flow restrictors. The first and second on/off valves may be altered between an open state and a closed state. When both the first and second on/off valves are in an open state, first and second gas flows are delivered to first and second outlets. The first and second gas flows are provided at a known ratio to one another, this ratio determined by the ratio of the resistance to flow of the first and second flow restrictors.

20 Claims, 5 Drawing Sheets

(56) References Cited

U.S. PATENT DOCUMENTS

| | | |
|---|---|---|
| 3,504,692 A | 4/1970 | Goldstein |
| 3,559,482 A | 2/1971 | Baker et al. |
| 3,570,807 A | 3/1971 | Sturman et al. |
| 3,807,456 A | 4/1974 | Colletti |
| 3,814,541 A | 6/1974 | Dent et al. |
| 3,841,520 A | 10/1974 | Bryant et al. |
| 3,910,113 A | 10/1975 | Brown |
| 4,015,626 A | 4/1977 | Thordarson |
| 4,096,746 A | 6/1978 | Wilson et al. |
| 4,118,009 A | 10/1978 | Chmura |
| 4,203,465 A | 5/1980 | Rissi |
| 4,253,156 A | 2/1981 | Lisle et al. |
| 4,275,752 A | 6/1981 | Collier et al. |
| 4,304,263 A | 12/1981 | Choate |
| 4,315,523 A | 2/1982 | Mahawili et al. |
| 4,327,757 A | 5/1982 | Weevers |
| 4,406,161 A | 9/1983 | Locke et al. |
| 4,462,915 A | 7/1984 | Friedman |
| 4,527,600 A | 7/1985 | Fisher et al. |
| 4,576,043 A | 3/1986 | Nguyen |
| 4,589,440 A | 5/1986 | Panet |
| 4,718,443 A | 1/1988 | Adney et al. |
| 4,741,359 A | 5/1988 | Siebald |
| 4,796,651 A | 1/1989 | Ginn et al. |
| 4,858,643 A | 8/1989 | Vavra et al. |
| 4,888,117 A | 12/1989 | Brown et al. |
| 4,904,285 A | 2/1990 | Yamada et al. |
| 4,918,995 A | 4/1990 | Pearman et al. |
| 5,003,810 A | 4/1991 | Jepson et al. |
| 5,044,199 A | 9/1991 | Drexel et al. |
| 5,052,363 A | 10/1991 | Stiles |
| 5,062,446 A | 11/1991 | Anderson |
| 5,080,131 A | 1/1992 | Ono et al. |
| 5,100,100 A | 3/1992 | Benson et al. |
| 5,100,551 A | 3/1992 | Pall et al. |
| 5,114,447 A | 5/1992 | Davis et al. |
| 5,123,439 A | 6/1992 | Powers |
| 5,129,418 A | 7/1992 | Shimomura et al. |
| 5,152,483 A | 10/1992 | Maeng |
| 5,159,951 A | 11/1992 | Ono et al. |
| 5,161,576 A | 11/1992 | Hekkert et al. |
| 5,187,771 A | 2/1993 | Uchida |
| 5,187,972 A | 2/1993 | Defriez |
| 5,190,068 A | 3/1993 | Philbin |
| 5,259,243 A | 11/1993 | Drexel et al. |
| 5,280,773 A | 1/1994 | Becker |
| 5,285,673 A | 2/1994 | Drexel et al. |
| 5,297,427 A | 3/1994 | Shambayati |
| 5,305,638 A | 4/1994 | Saghatchi et al. |
| 5,311,762 A | 5/1994 | Drexel |
| 5,321,992 A | 6/1994 | Mudd et al. |
| 5,325,705 A | 7/1994 | Tom |
| 5,329,966 A | 7/1994 | Fenimore et al. |
| 5,359,878 A | 11/1994 | Mudd |
| 5,419,133 A | 5/1995 | Schneider |
| 5,439,026 A | 8/1995 | Moriya et al. |
| 5,445,035 A | 8/1995 | Delajoud |
| 5,511,585 A | 4/1996 | Lee |
| 5,542,284 A | 8/1996 | Layzell et al. |
| 5,549,272 A | 8/1996 | Kautz |
| 5,583,282 A | 12/1996 | Tom |
| 5,624,409 A | 4/1997 | Seale |
| 5,660,207 A | 8/1997 | Mudd |
| 5,669,408 A | 9/1997 | Nishino et al. |
| 5,711,786 A | 1/1998 | Hinishaw |
| 5,730,181 A | 3/1998 | Doyle et al. |
| 5,762,086 A | 6/1998 | Ollivier |
| 5,804,717 A | 9/1998 | Lucas |
| 5,816,285 A | 10/1998 | Ohmi et al. |
| 5,865,205 A | 2/1999 | Wilmer |
| 5,868,159 A | 2/1999 | Loan et al. |
| 5,904,170 A | 5/1999 | Harvey et al. |
| 5,911,238 A | 6/1999 | Bump et al. |
| 5,917,066 A | 6/1999 | Eisenmann et al. |
| 5,918,616 A | 7/1999 | Sanfilippo et al. |
| 5,935,418 A | 8/1999 | Chakrabarty et al. |
| 5,944,048 A | 8/1999 | Bump et al. |
| 5,970,801 A | 10/1999 | Ciobanu et al. |
| 5,975,126 A | 11/1999 | Bump et al. |
| 5,988,211 A | 11/1999 | Cornell |
| 6,015,590 A | 1/2000 | Suntola |
| 6,026,834 A | 2/2000 | Azima |
| 6,026,847 A | 2/2000 | Reinicke et al. |
| 6,062,246 A | 5/2000 | Tanaka et al. |
| 6,062,256 A | 5/2000 | Miller et al. |
| 6,068,016 A * | 5/2000 | Manofsky, Jr. ..... C23C 16/4408 137/269 |
| 6,074,691 A | 6/2000 | Schmitt et al. |
| 6,080,219 A | 6/2000 | Jha et al. |
| 6,116,269 A | 9/2000 | Maxson |
| 6,119,710 A | 9/2000 | Brown |
| 6,125,869 A | 10/2000 | Horiuchi |
| 6,125,887 A * | 10/2000 | Pinto ................. F16K 27/003 137/884 |
| 6,138,708 A | 10/2000 | Waldbusser |
| 6,152,162 A | 11/2000 | Balazy et al. |
| 6,178,995 B1 | 1/2001 | Ohmi et al. |
| 6,269,692 B1 | 8/2001 | Drexel et al. |
| 6,303,501 B1 | 10/2001 | Chen et al. |
| 6,314,991 B1 | 11/2001 | Gill |
| 6,352,001 B1 | 3/2002 | Wickert et al. |
| 6,422,256 B1 | 7/2002 | Balazy et al. |
| 6,422,264 B2 | 7/2002 | Ohmi et al. |
| 6,425,281 B1 | 7/2002 | Sheriff et al. |
| 6,443,174 B2 | 9/2002 | Mudd |
| 6,539,968 B1 | 4/2003 | White et al. |
| 6,561,218 B2 | 5/2003 | Mudd |
| 6,564,825 B2 | 5/2003 | Lowery et al. |
| 6,631,334 B2 | 10/2003 | Grosshart |
| 6,642,281 B1 | 11/2003 | Long et al. |
| 6,655,408 B2 | 12/2003 | Linthorst |
| 6,712,084 B2 | 3/2004 | Shajii et al. |
| 6,752,166 B2 | 6/2004 | Lull et al. |
| 6,799,603 B1 | 10/2004 | Moore |
| 6,832,628 B2 | 12/2004 | Thordarson et al. |
| 6,868,862 B2 | 3/2005 | Shajii et al. |
| 6,881,263 B2 | 4/2005 | Lindfors et al. |
| 6,948,508 B2 | 9/2005 | Shajii et al. |
| 7,037,372 B2 | 5/2006 | Lindfors et al. |
| 7,073,392 B2 | 7/2006 | Lull et al. |
| 7,136,767 B2 | 11/2006 | Shajii et al. |
| 7,216,019 B2 | 5/2007 | Tinsley et al. |
| 7,252,032 B2 | 8/2007 | Scheffel et al. |
| 7,334,602 B2 | 2/2008 | Ahn |
| 7,337,805 B2 | 3/2008 | Brown et al. |
| 7,353,841 B2 | 4/2008 | Kono et al. |
| 7,370,664 B2 | 5/2008 | Glite |
| 7,424,346 B2 | 9/2008 | Shajii et al. |
| 7,431,045 B2 | 10/2008 | Mudd et al. |
| 7,474,968 B2 | 1/2009 | Ding et al. |
| 7,552,015 B2 | 6/2009 | Shajii et al. |
| 7,615,120 B2 | 11/2009 | Shajii et al. |
| 7,628,861 B2 | 12/2009 | Clark |
| 7,662,233 B2 | 2/2010 | Sneh |
| 7,680,399 B2 | 3/2010 | Buchanan et al. |
| 7,682,946 B2 | 3/2010 | Ma et al. |
| 7,693,606 B2 | 4/2010 | Ahmad et al. |
| 7,706,925 B2 | 4/2010 | Ding et al. |
| 7,717,061 B2 | 5/2010 | Ishizaka et al. |
| 7,757,554 B2 | 7/2010 | Ding et al. |
| 7,809,473 B2 | 10/2010 | Shajii et al. |
| 7,826,986 B2 | 11/2010 | McDonald |
| 7,850,779 B2 | 12/2010 | Ma et al. |
| 7,874,208 B2 | 1/2011 | Redemann et al. |
| 7,881,829 B2 | 2/2011 | Yoneda et al. |
| 7,891,228 B2 | 2/2011 | Ding et al. |
| 7,905,139 B2 | 3/2011 | Lull |
| 7,918,238 B2 * | 4/2011 | Tanaka .................. G01F 1/6847 137/10 |
| 7,922,150 B2 | 4/2011 | Cripps et al. |
| 7,974,544 B2 | 7/2011 | Kobayashi |
| 7,979,165 B2 | 7/2011 | Gotoh et al. |
| 8,019,481 B2 | 9/2011 | Yamaguchi et al. |
| 8,100,382 B2 | 1/2012 | Robertson, III et al. |

(56) References Cited

U.S. PATENT DOCUMENTS

| | | |
|---|---|---|
| 8,104,323 B2 | 1/2012 | Yasuda |
| 8,112,182 B2 | 2/2012 | Tokuhisa et al. |
| 8,183,781 B2 | 5/2012 | Sangam |
| 8,201,989 B2 | 6/2012 | Itoh et al. |
| 8,205,629 B2 | 6/2012 | Gregor et al. |
| 8,265,795 B2 | 9/2012 | Takahashi et al. |
| 8,282,992 B2 | 10/2012 | Myo et al. |
| 8,291,857 B2 | 10/2012 | Lam et al. |
| 8,293,015 B2 | 10/2012 | Lam et al. |
| 8,340,827 B2 | 12/2012 | Yun et al. |
| 8,343,258 B2 | 1/2013 | Guan |
| 8,343,279 B2 | 1/2013 | Myo et al. |
| 8,356,623 B2 | 1/2013 | Isobe et al. |
| 8,376,312 B2 | 2/2013 | Mudd et al. |
| 8,382,897 B2 | 2/2013 | Sangam |
| 8,408,245 B2 | 4/2013 | Feldman et al. |
| 8,443,649 B2 | 5/2013 | Yasuda et al. |
| 8,460,753 B2 | 6/2013 | Xiao et al. |
| 8,504,318 B2 | 8/2013 | Mendelson et al. |
| 8,505,478 B2 | 8/2013 | Suekane et al. |
| 8,511,337 B2 | 8/2013 | Nishimura |
| 8,573,247 B2 | 11/2013 | Ushigusa et al. |
| 8,744,784 B2 | 6/2014 | Yasuda et al. |
| 8,746,057 B2 | 6/2014 | Yasuda et al. |
| 8,770,215 B1 | 7/2014 | Mudd et al. |
| 8,789,556 B2 | 7/2014 | Yasuda et al. |
| 8,793,082 B2 | 7/2014 | Ding et al. |
| 8,800,589 B2 | 8/2014 | Minami et al. |
| 8,851,105 B2 | 10/2014 | Kashima et al. |
| 8,910,656 B2 | 12/2014 | Yasuda |
| 8,915,262 B2 | 12/2014 | Smirnov |
| 8,950,433 B2* | 2/2015 | Manofsky, Jr. .......... G05D 7/00 137/884 |
| 9,027,585 B2 | 5/2015 | Smirnov |
| 9,081,388 B2 | 7/2015 | Tanaka et al. |
| 9,188,989 B1 | 11/2015 | Mudd et al. |
| 9,207,139 B2 | 12/2015 | Jones et al. |
| 9,223,318 B2 | 12/2015 | Takeuchi et al. |
| 9,690,301 B2 | 6/2017 | Mudd et al. |
| 9,940,004 B2 | 4/2018 | Mayworm |
| 2001/0013363 A1 | 8/2001 | Kitayama et al. |
| 2002/0002996 A1 | 1/2002 | Mudd |
| 2002/0014206 A1 | 2/2002 | Mudd |
| 2002/0046612 A1 | 4/2002 | Mudd |
| 2002/0095225 A1 | 7/2002 | Huang et al. |
| 2004/0007180 A1 | 1/2004 | Yamasaki et al. |
| 2004/0050325 A1* | 3/2004 | Samoilov .......... H01L 21/67017 118/715 |
| 2004/0083807 A1 | 5/2004 | Mudd et al. |
| 2005/0056211 A1 | 3/2005 | Lindfors et al. |
| 2005/0087299 A1 | 4/2005 | Okabe et al. |
| 2005/0098906 A1 | 5/2005 | Satoh et al. |
| 2006/0005883 A1 | 1/2006 | Mudd et al. |
| 2006/0037644 A1 | 2/2006 | Nishikawa et al. |
| 2006/0060139 A1 | 3/2006 | Meneghini et al. |
| 2006/0060253 A1 | 3/2006 | Yoshida et al. |
| 2006/0124173 A1 | 6/2006 | An |
| 2006/0130755 A1 | 6/2006 | Clark |
| 2006/0185746 A1 | 8/2006 | Doyle |
| 2007/0089789 A1 | 4/2007 | Mudd et al. |
| 2007/0110636 A1 | 5/2007 | Lee et al. |
| 2007/0227659 A1 | 10/2007 | Iizuka |
| 2008/0041481 A1 | 2/2008 | Mudd et al. |
| 2008/0305014 A1 | 12/2008 | Honda |
| 2009/0101217 A1 | 4/2009 | Ushigusa et al. |
| 2010/0005904 A1 | 1/2010 | Igarashi |
| 2010/0110399 A1 | 5/2010 | Lyons |
| 2010/0138051 A1 | 6/2010 | Glime |
| 2010/0154895 A1 | 6/2010 | Igarashi |
| 2010/0163135 A1 | 7/2010 | Safronovs |
| 2010/0224264 A1 | 9/2010 | Homan et al. |
| 2010/0269924 A1 | 10/2010 | Yasuda |
| 2011/0108126 A1 | 5/2011 | Monkowski et al. |
| 2011/0248000 A1* | 10/2011 | Barhorst ................ B23K 9/173 219/74 |
| 2012/0116596 A1 | 5/2012 | Yoneda et al. |
| 2012/0132291 A1 | 5/2012 | Monkowski et al. |
| 2012/0180876 A1 | 7/2012 | Hayashi et al. |
| 2012/0318383 A1 | 12/2012 | Yasuda et al. |
| 2013/0092256 A1 | 4/2013 | Yasuda et al. |
| 2013/0092258 A1 | 4/2013 | Yasuda et al. |
| 2013/0118596 A1 | 5/2013 | Horsky |
| 2013/0186499 A1 | 7/2013 | Yada et al. |
| 2014/0034164 A1 | 2/2014 | Yasuda |
| 2014/0069527 A1* | 3/2014 | Mudd .................. G05D 7/0635 137/487 |
| 2014/0083514 A1 | 3/2014 | Ding |
| 2014/0158211 A1 | 6/2014 | Ding et al. |
| 2014/0182692 A1 | 7/2014 | Hirata et al. |
| 2014/0190578 A1 | 7/2014 | Hayashi |
| 2014/0230915 A1 | 8/2014 | Mudd et al. |
| 2014/0260963 A1 | 9/2014 | Wang |
| 2015/0007897 A1 | 1/2015 | Valentine et al. |
| 2015/0027558 A1 | 1/2015 | Kehoe et al. |
| 2015/0047738 A1 | 2/2015 | Wilson et al. |
| 2015/0121988 A1 | 5/2015 | Banares et al. |
| 2015/0212524 A1 | 7/2015 | Kehoe et al. |
| 2015/0362391 A1 | 12/2015 | Suzuki et al. |
| 2016/0011604 A1 | 1/2016 | Mudd et al. |
| 2016/0018828 A1 | 1/2016 | Mudd et al. |
| 2016/0041564 A1 | 2/2016 | Mudd et al. |
| 2016/0108523 A1* | 4/2016 | Lee ...................... C23C 16/042 156/89.11 |
| 2016/0124439 A1 | 5/2016 | Yasuda et al. |
| 2017/0082076 A1 | 3/2017 | Ge |
| 2019/0072102 A1* | 3/2019 | Zhang .................. F04D 29/124 |
| 2019/0243393 A1* | 8/2019 | Mudd ...................... F16K 27/003 |

FOREIGN PATENT DOCUMENTS

| | | |
|---|---|---|
| CN | 102096420 A1 | 6/2011 |
| CN | 102354228 | 2/2012 |
| CN | 103838261 | 6/2014 |
| DE | 69535683 | 1/2009 |
| EP | 0468793 | 1/1992 |
| EP | 0671484 | 9/1995 |
| EP | 0689040 | 12/1995 |
| JP | 11119835 | 4/1999 |
| JP | 2000018407 | 1/2000 |
| JP | 2004157719 | 6/2004 |
| JP | 3557087 | 8/2004 |
| JP | 2004302914 | 10/2004 |
| JP | 2007041870 | 2/2007 |
| JP | 4137666 | 8/2008 |
| JP | 4146746 | 9/2008 |
| JP | 2009079667 | 4/2009 |
| JP | 4351495 | 10/2009 |
| JP | 2009300403 | 12/2009 |
| JP | 4572139 | 10/2010 |
| JP | 4589846 | 12/2010 |
| JP | 4705140 | 6/2011 |
| JP | 2011171337 | 9/2011 |
| JP | 4974000 | 7/2012 |
| JP | 5090559 | 12/2012 |
| JP | 5091821 | 12/2012 |
| JP | 2016035462 | 3/2016 |
| TW | 201414990 | 4/2014 |
| WO | WO8700267 | 1/1987 |
| WO | WO2003081361 | 10/2003 |
| WO | WO200401516 | 12/2003 |
| WO | WO2011040409 | 4/2011 |
| WO | WO2014/152755 A2 | 9/2014 |

* cited by examiner

APPARATUS FOR SPLITTING FLOW OF PROCESS GAS AND METHOD OF OPERATING SAME

BACKGROUND OF THE INVENTION

Mass flow control has been one of the key technologies in semiconductor chip fabrication. Apparatuses for controlling mass flow are important for delivering known flow rates of process gases for semiconductor fabrication and other industrial processes. Such devices are used to measure and accurately control the flow of fluids for a variety of applications. Such devices may also be used for splitting flows of process gases into known ratios.

As the technology of chip fabrication has improved, so has the demand on the apparatuses for controlling flow. Semiconductor fabrication processes increasingly require increased performance, including more accurate measurements, lower equipment costs, improved transient response times, and more consistency in timing in the delivery of gases. In certain processes, it can be beneficial to split process gases and gas mixtures into known proportions so that they can be selectively applied to different regions of articles being processed in a processing chamber.

SUMMARY OF THE INVENTION

The present technology is directed to an apparatus for splitting a flow of process gases into two separate mass flows for use at different locations in a processing chamber.

In one embodiment, the invention is a gas flow control system for delivering a plurality of gas flows. The gas flow control system includes a gas flow path extending from a gas inlet to a first gas outlet and a second gas outlet. A first on/off valve is operably coupled to the gas flow path and is located between the gas inlet and the first gas outlet. A second on/off valve is operably coupled to the gas flow path and located between the gas inlet and the second gas outlet. A first flow restrictor having a first flow impedance is operably coupled to the gas flow path and located between the gas inlet and the first gas outlet. A second flow restrictor having a second flow impedance is operably coupled to the gas flow path and located between the gas inlet and the second gas outlet. When both the first and second on/off valves are in a fully open state, a ratio between a first gas flow from the first gas outlet and a second gas flow from the second gas outlet is determined by a ratio of the first flow impedance and the second flow impedance.

In another embodiment, the invention is a gas flow control system for delivering a plurality of gas flows including a gas flow path extending from a gas inlet to a first gas outlet and a second gas outlet. A first valve is operably coupled to the gas flow path and located between the gas inlet and the first gas outlet. A second valve is operably coupled to the gas flow path and located between the gas inlet and the second gas outlet. A first flow restrictor having a first flow impedance is operably coupled to the gas flow path and located between the gas inlet and the first gas outlet. A second flow restrictor having a second flow impedance is operably coupled to the gas flow path and located between the gas inlet and the second gas outlet.

In yet another embodiment, the invention is a method of delivering a process gas. The method includes providing a gas flow apparatus having a gas flow path extending from a gas inlet to a first gas outlet and a second gas outlet, a first valve operably coupled to the gas flow path and located between the gas inlet and the first gas outlet, a second valve operably coupled to the gas flow path and located between the gas inlet and the second gas outlet, a first flow restrictor having a first flow impedance operably coupled to the gas flow path and located between the gas inlet and the first gas outlet, and a second flow restrictor having a second flow impedance operably coupled to the gas flow path and located between the gas inlet and the second gas outlet. The first valve is transitioned to a fully open state and the second valve to a fully closed state to deliver a first controlled flow of process gas to the first gas outlet. Subsequently, the second valve is transitioned to a fully open state and the first valve to a fully closed state to deliver a second controlled flow of process gas to the second gas outlet. Finally, the first valve is transitioned to a fully open state to deliver the first controlled flow of process gas to the first gas outlet simultaneously with delivering the second controlled flow of process gas to the second gas outlet.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein.

DETAILED DESCRIPTION

Figure 1:
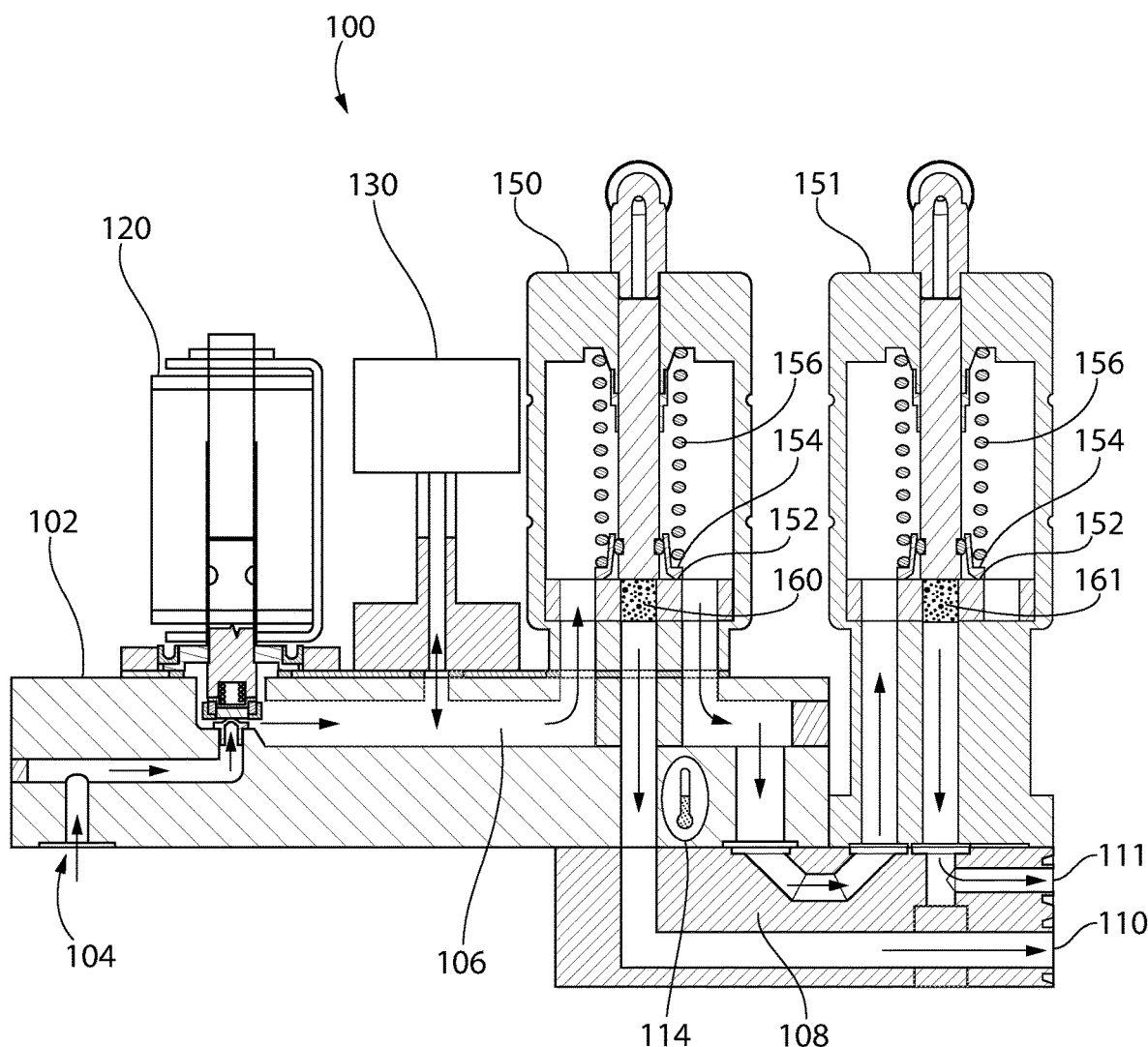
FIG. 1 is a schematic view of an apparatus for controlling gas flow showing the flow path of the process gases through the apparatus.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to an apparatus for splitting a flow of process gas into two individual flows of process gas having a known ratio. In some embodiments, the apparatus may also function as a mass flow controller to deliver a known mass flow of gas to a semiconductor or similar process. Semiconductor fabrication is one industry which demands high performance in control of gas flows. As semiconductor fabrication techniques have advanced, customers have recognized the need for splitting a gas flow into two or more separate flows having known ratios. Modern semiconductor processes require that the mass of the gas flow is tightly controlled, the response time minimized, and the ratio between the gas flows is highly accurate. The present invention delivers improved dynamic performance while maintaining exceptional accuracy in the flows delivered. Furthermore, mixtures of a variety of gases may be split with no loss of accuracy in the delivered ratio of flows.

FIG. 1 shows a schematic view of an apparatus for controlling flow 100. The flow path of the process gas is indicated by arrows which illustrate the path that the process gas takes through the apparatus 100. The apparatus 100 has a base 102 comprising an inlet 104 and an outlet 110. A supply of process gas is delivered to the inlet 104 of the base 102. The process gas then flows through a proportional valve 120 into a P1 volume 106 within the base 102. The proportional valve 120 meters the mass flow of process gas which passes to the P1 volume 106. The proportional valve 120 is capable of providing proportional control of the process gas such that it need not be fully open or closed, but instead may have intermediate states to permit control of the mass flow rate of process gas.

A P1 pressure transducer 130 is fluidly coupled to the P1 volume 106 so that the P1 pressure transducer 130 can sample the pressure within the P1 volume 106. In some embodiments, the P1 pressure transducer 130 is physically coupled to the base 102, while in others it is remotely mounted and coupled via a tube, hose, or another component such as the proportional valve 120. Next, the process gas flows out of the P1 volume 106 into a first on/off valve 150. Internal to the first on/off valve 150 is a valve seat 152 and a closure member 154. When the apparatus 100 is delivering process gas, the first on/off valve 150 is in an open state, such that the valve seat 152 and the closure member 154 are not in contact. This permits flow of the process gas, and provides a negligible restriction to fluid flow. When the first on/off valve 150 is in a closed state the closure member 154 and the valve seat 152 are biased into contact by the spring 156, stopping the flow of process gas through the first on/off valve 150.

Downstream of the valve seat 152, a first flow restrictor 160 is introduced into the flow path to meter flow. The first flow restrictor 160 provides a restriction to fluid flow, or flow impedance. In some embodiments, the flow impedance is known. However, it is also conceived that the flow impedance of the first flow restrictor 160 may not be known. In yet other embodiments, the first flow restrictor 160 may be located upstream of the first on/off valve 150. The first flow restrictor 160 may be selected to have a specific flow impedance so as to achieve a desired range of gas flow rates. The flow impedance does not need to be characterized across the entire range of anticipated gas flows. Instead, it may merely be selected to have an approximate flow impedance.

The first flow restrictor 160 may be formed as a porous block, a device having small orifices or channels, or any other means of providing a restriction to process gas flow that is consistent and repeatable across a target dynamic operating range of mass flow rates. The first flow restrictor 160 has a greater resistance to flow than the passages upstream and downstream of the first flow restrictor 160. After passing through the flow restrictor 160, the process gas exits through the first outlet 110. Generally, the first outlet 110 of the apparatus 100 is coupled to a first process header, the first process header directing a plurality of process gases to a first applicator in the processing chamber, the processing chamber being the part of the process equipment where articles are processed.

The P1 volume 106 is also fluidly coupled to a second on/off valve 151, the second on/off valve also having a valve seat 152 and a closure member 154, similar to the first on/off valve 150. When in the open state, the second on/off valve 151 allows gas to flow from the P1 volume 106, through a second flow restrictor 161, to a second outlet 111. The second flow restrictor 161 may have the same or different construction as the first flow restrictor 160. Like the first flow restrictor 160, the second flow restrictor 161 may be located either upstream or downstream of the valve seat 152 of the on/off valve 151. In all cases, the second flow restrictor 161 has a greater resistance to flow than the passages upstream and downstream of the second flow restrictor 161. In some embodiments, the second flow restrictor 161 has the same resistance to flow as the first flow restrictor 160. In other embodiments, the second flow restrictor 161 has a greater or lesser resistance to flow as compared with the first flow restrictor 160. The second outlet 111 is connected to a second process header which directs a plurality of process gases to a second applicator in the processing chamber. In yet other embodiments, the first and second on/off valves 151, 152 may be replaced with a plurality of similar valves. In yet other embodiments, the first and second on/off valves 151, 152 may be substituted for proportional valves.

In some embodiments, the proportional valve 120, pressure transducer 130, and first and second on/off valves 150, 151 are all directly mounted to the base 102 while the first and second flow restrictors 160, 161 are mounted to the first and second on/off valves 150, 151. Thus, the first and second flow restrictors 160, 161 are indirectly coupled to the base while the proportional valve 120, pressure transducer 130, and first and second on/off valves 150, 151 are all directly coupled to the base. In yet other embodiments, each of the proportional valve 120, pressure transducer 130, first and second on/off valves 150, 151, and first and second flow restrictors 160, 161 are directly coupled to the base 102. In yet other embodiments, it is possible to remotely mount one or more of the proportional valve 120, pressure transducer 130, first and second on/off valves 150, 151, and first and second flow restrictors 160, 161 such that they are operably coupled but neither directly nor indirectly mounted to the base 102. In yet other embodiments, the base 102 may be omitted.

Optionally, the apparatus 100 comprises one or more P2 pressure transducers downstream of the flow restrictors 160, 161 and the on/off valves 150, 151. The P2 pressure transducer is used to measure the pressure differential across the flow restrictors 160, 161. In some embodiments, the pressure downstream of only one of the two flow restrictors 160, 161 is measured. In other embodiments, the pressure downstream of both of the flow restrictors 160, 161 is measured. In yet other embodiments, the P2 pressure downstream of either or both flow restrictors 160, 161 may be obtained from another apparatus 100 connected to the first or second process header, with the readings communicated to the first apparatus 100.

Optionally, temperature sensors may be employed to further enhance the accuracy of the apparatus 100. A temperature sensor 114 is shown in FIG. 1, located within the base 102 so that it can measure the temperature near the P1 volume 106. Additional temperature sensors 114 may be employed in a variety of locations, including the proportional valve 120, the pressure transducer 130, and the first and second on/off valves 150, 151.

In yet a further embodiment, the apparatus 100 may omit the proportional valve 120 and the P1 pressure transducer. In this embodiment, the process gas is supplied to the gas inlet 104 at a known pressure. The pressure of the process gas may be varied external to the apparatus 100 and may change over time.

Figure 2:
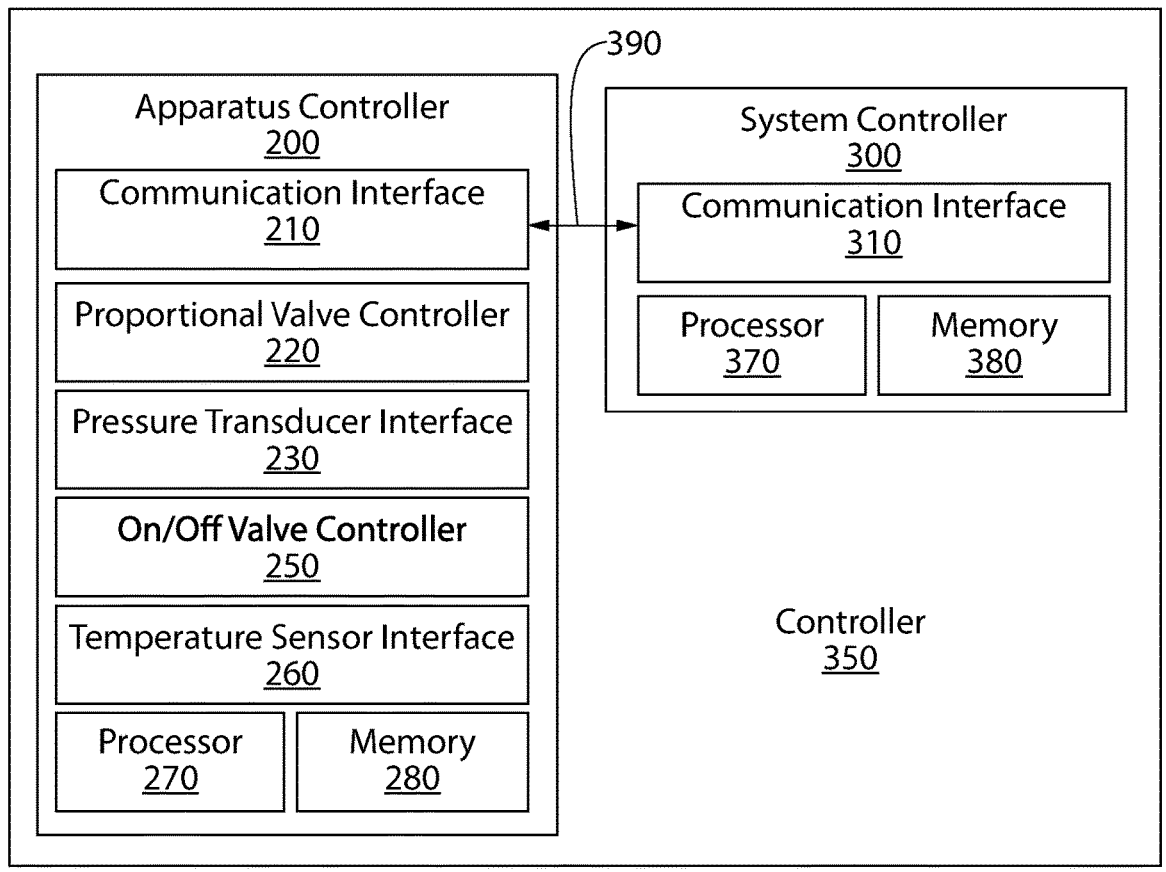
FIG. 2 is a block diagram illustrating the control system for the apparatus of FIG. 1.
Figure 3:
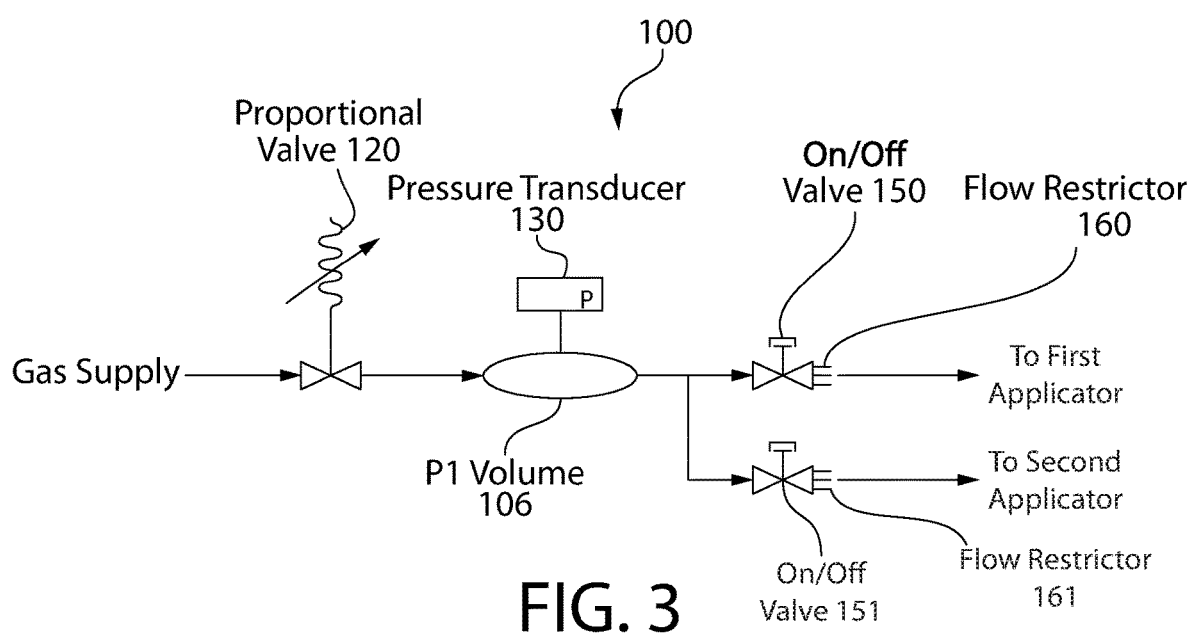
FIG. 3 is a schematic diagram of the apparatus of FIG. 1.

Turning to FIG. 2, a block diagram illustrates the control system for the apparatus 100 of FIG. 1. This block diagram shows a controller 350 which comprises an apparatus controller 200 and a system controller 300. The apparatus controller 200 provides all control functions for the apparatus 100. The apparatus controller 200 has a communication interface 210, a proportional valve controller 220, a pressure transducer interface 230, an on/off valve controller 250, a temperature sensor interface 260, a processor 270, and memory 280. The communication interface 210 is configured to provide a communications link between the apparatus controller 200 and the system controller 300. Optionally, the temperature sensor interface 260 may be omitted if the additional accuracy provided by the temperature sensor 114 is not required.

The system controller 300 has a corresponding communication interface 310, a processor 370, and memory 380. The system controller 300 coordinates all high-level functions necessary to perform the desired process. The communication interface 310 of the system controller 300 sends and receives commands through a communications bus 390. The communications bus 390 connects to the communication interface 210 of the apparatus controller 210 of the apparatus 100. The communications bus 390 may connect to a single apparatus controller 200, or it may connect to a plurality of apparatus controllers 200, each apparatus controller 200 operating a distinct device. Not all apparatus controllers 200 need control an apparatus for controlling gas flow 100. Instead, other types of process equipment may also be controlled. Furthermore, there may be a plurality of communications buses 390 to connect all the devices required to perform the desired process.

The apparatus 100 according to the present invention is capable of serving several roles in a system for processing articles. In one configuration, the apparatus 100 is used with a process gas having a known composition. In this configuration, either one of the first and second on/off valves 150, 151 may be operated to deliver a known mass flow rate of the process gas to either one of the first or second process headers. In this way, a single apparatus 100 can serve as a mass flow controller for two separate applicators. Full control over a wide range of mass flow rates can be achieved for both applicators. However, this configuration requires that the memory 280 of the apparatus controller 200 store a gas map containing information permitting precise calculation of the pressure drop across one or more of the flow restrictors 160, 161 required to achieve a predetermined mass flow rate at the respective outlet 110, 111. The gas map must be calibrated for the process gas utilized and corresponds to the flow impedance of the flow restrictors 160, 161 across the operating range of the apparatus 100.

In a second configuration, the apparatus 100 is used to simultaneously deliver process gas at a known ratio to the outlets 110, 111. The ratio is determined by the ratio of the flow impedances of the first and second flow restrictors 160, 161. Thus, it is possible to simultaneously deliver two flows of process gas to the first and second outlets 110, 111 at a fixed ratio. In this configuration, the composition of the process gas does not need to be known, and may vary with time. This is because the ratio of the flow rates is determined by the ratio of the resistances to flow of the flow restrictors 160, 161 and remains constant regardless of the gas mixture. There is no need to store a gas map for the process gas in the memory 280 of the apparatus controller 200 in this configuration.

In the second configuration, it is also possible to accurately control a mass flow rate of one of the two flows delivered to the outlets 110, 111 while simultaneously providing a known ratio between the flow flows. This requires a known composition of gas and an appropriately calibrated gas map, but permits the user to split the flow of process gas into two separate flows while simultaneously controlling the mass flow rate at one of the two outlets.

By controlling the ratio between the flow impedances for each of the flow restrictors 160, 161, an accuracy of 99% or greater can be achieved for the splitting of the flow of process gas, even where the mixture of process gas is unknown. In some embodiments, it is also possible to extend the apparatus 100 to include more than two on/off valves 150, 151 to split the process gas into three or more different flows of known ratios. It is also possible to provide two or more proportional valves 120 in the same device, with each proportional valve 120 directly connected to a single on/off valve, enabling separate control of the pressure differential across each of the flow restrictors 160, 161. This enables variable control over the flow ratio between the outlets.

The present invention also minimizes flow spikes and reduces the transient turn-on and turn-off times for the flows of process gas. By locating the flow restrictors 160, 161 in the respective on/off valves 150, 151, the volume that must be charged or bled during turn-on and turn-off is minimized. The time required to start and stop flow is largely driven by the speed at which the on/off valves 150, 151 can open and close, and pressure and flow pulses are also minimized. Typical turn-on times for the on/off valves 150, 151 are between 50 and 100 milliseconds, permitting exceptionally fast control over the delivery of process gas to the respective applicators in the processing chamber. Furthermore, the pressure of the process gas supplied to the apparatus 100 is unimportant because the ratio between the mass flow rates remains constant regardless of the supplied pressure.

Figure 4:
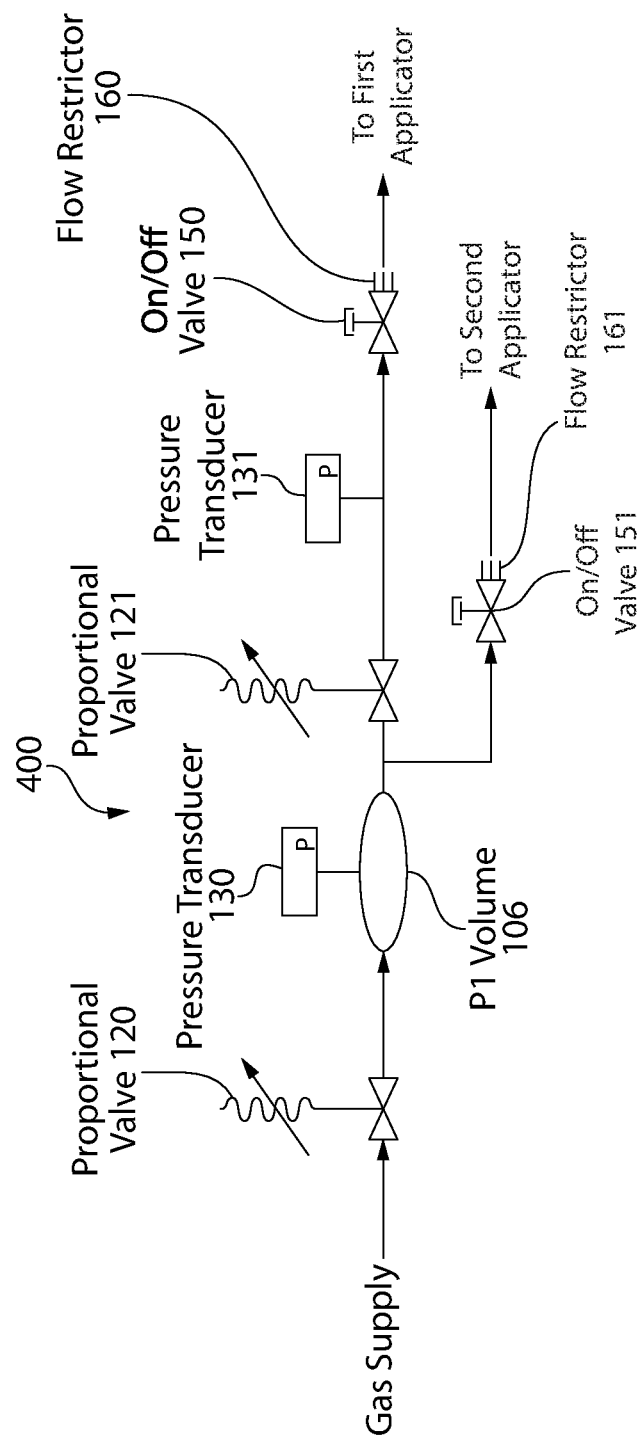
FIG. 4 is a schematic diagram of another embodiment of the invention having an additional proportional valve.

In yet another embodiment shown schematically in FIG. 4, an apparatus 400 has a second proportional valve 121 and a second pressure transducer 131 are incorporated in the gas flow path between the P1 pressure transducer and the first on/off valve 150. A second pressure transducer 131 monitors the pressure between the proportional valve 121 and the flow restrictor 160. This variation enables independent control of gas flows delivered to both the first and second applicators. It is possible to deliver gas flows which deviate from the ratio of the flow impedance between the first and second flow restrictors 160, 161 by separately controlling the pressure of the gas in the P1 volume 106 and the pressure between the proportional valve 121 and the first flow restrictor 160. In some embodiments, the second pressure transducer 131 may be omitted.

Figure 5:
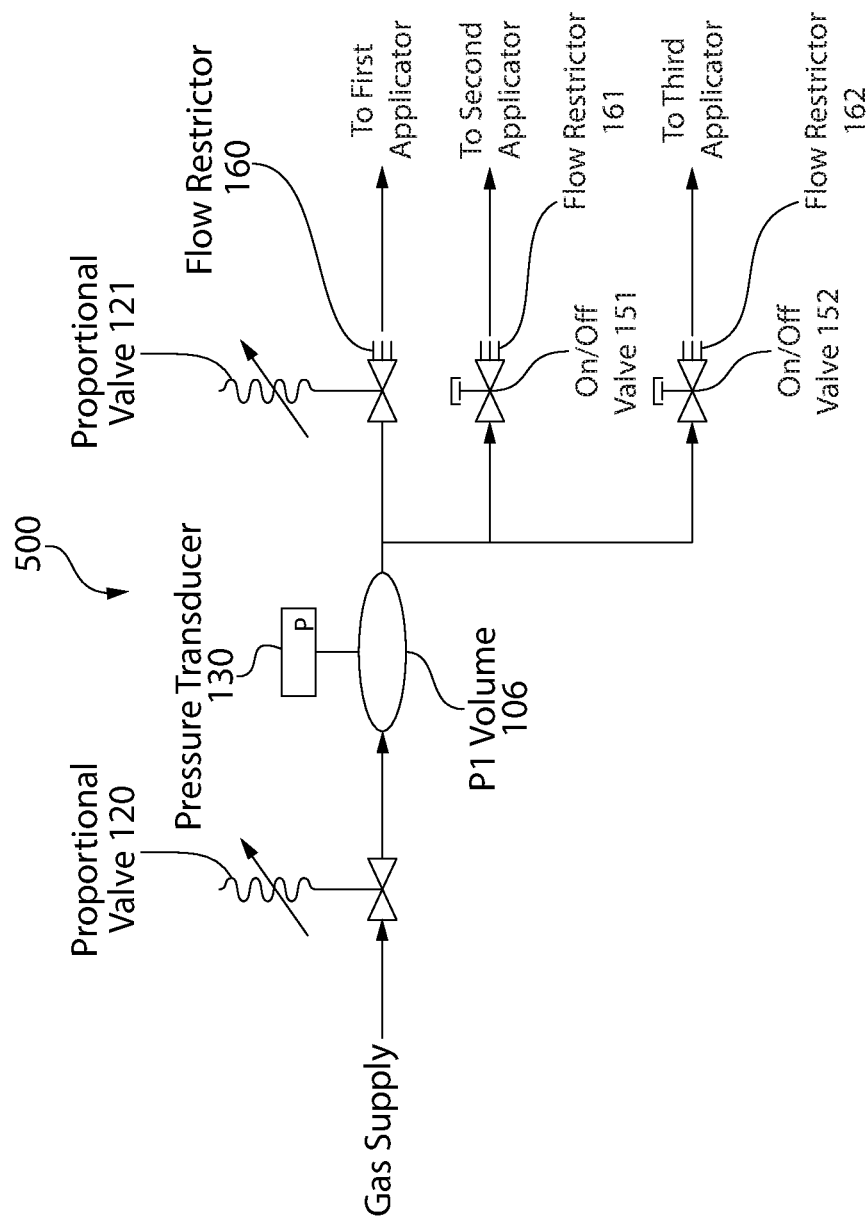
FIG. 5 is a schematic diagram of another embodiment of the invention having three gas outlets.

In the embodiment shown schematically in FIG. 5, three separate gas outlets are shown in an apparatus 500. The three gas outlets may be directed to first, second, and third applicators, or may be combined or divided further downstream as desired for a particular process. The apparatus substitutes the first on/off valve 150 for a second proportional valve 121. This allows three separate gas flows to be delivered at known ratios determined by the combination of the first, second, and third flow restrictors 160, 161, 162 when the proportional valve 121, the second on/off valve 151, and the third on/off valve 152 are all in the fully open state. Furthermore, the valves 121, 151, 152 may be selectively closed to deliver specific mass flows to one gas outlet at a time, or the gas may be split into two flows by closing only one of the three valves 121, 151, 152. Furthermore, the substitution of the proportional valve 121 for the first on/off valve 150 enables further control of the gas flow delivered to the first gas outlet. This arrangement is similar to that of FIG. 4. It will be noted that the second pressure transducer 131 of FIG. 4 is not required in all embodiments.

Figure 6:
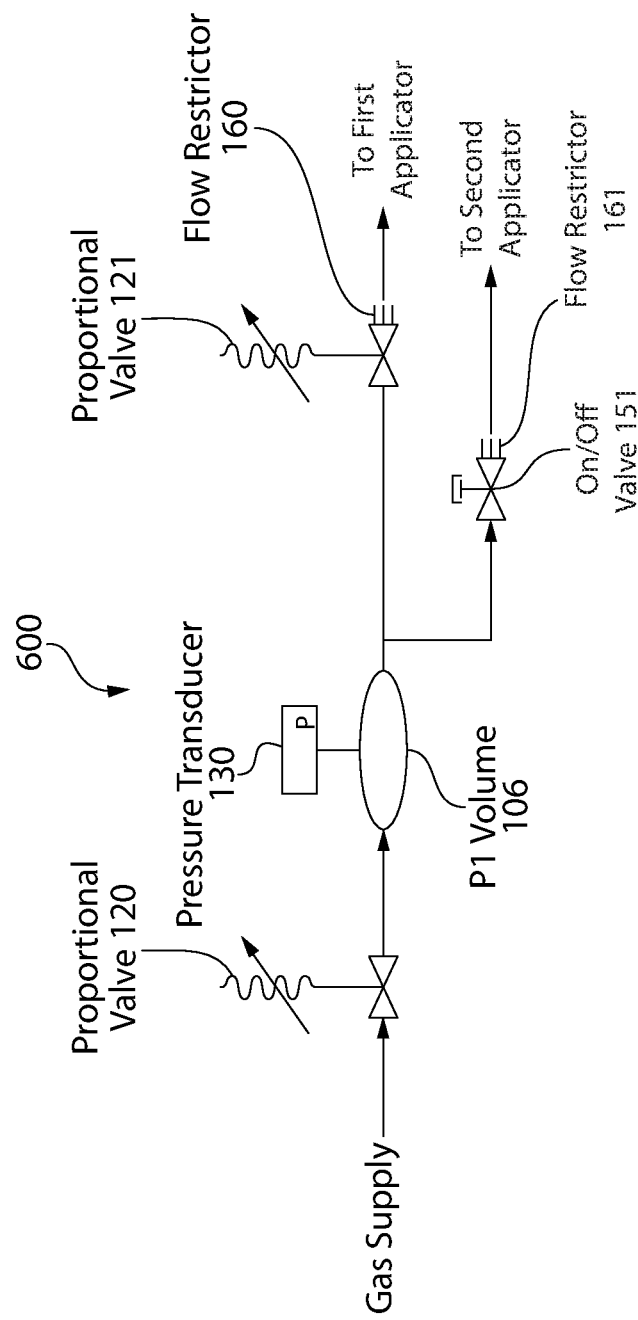
FIG. 6 is a schematic diagram of another embodiment of the invention utilizing two proportional valves and a single on/off valve.

In the embodiment of FIG. 6, an apparatus 600 has a proportional valve 121 in lieu of a first on/off valve. This enables identical function to the apparatus 100 with the added capability of further varying the gas flow rates through the gas outlets as discussed above. Nearly total control over the flow rates can be achieved with this configuration without the need for two separate mass flow controllers. Furthermore, approximate flow splitting can be achieved even when the exact composition of the gas is not known.

In a first method of operating the apparatuses, a process gas having a known composition is supplied to the inlet 104. The system controller 300 transmits a command to the apparatus controller 200 to flow gas from the first outlet 110 at a predetermined mass flow rate. In response, the proportional valve 120 is opened to permit the process gas to flow into the P1 volume 106. The first on/off valve 150 is opened while the second on/off valve 151 is closed. The apparatus controller 200 causes the proportional valve 120 to adjust its position to adjust the pressure in the P1 volume 106 based on feedback from the P1 pressure transducer 130. This causes a known mass flow rate to be delivered through the first on/off valve 150 and the first flow restrictor 160, and out of the first outlet 110. Subsequently, the apparatus controller 200 receives a command to flow gas through the second outlet 111 at a predetermined mass flow rate. The first on/off valve 150 is closed and the second on/off valve 151 is opened. The proportional valve 120 adjusts its position to drive the pressure in the P1 volume 106 to the pressure required to deliver the predetermined flow rate. In this method, a gas map which is accurately calibrated to the process gas being used is loaded into the memory 280 of the apparatus controller 200, which ensures that the correct mass flow rate is delivered to the appropriate outlet. Furthermore, the flow impedance for each of the flow restrictors 160, 161 is known with a high degree of accuracy. In some embodiments, there may be one gas map for each of the flow restrictors 160, 161 to ensure even greater accuracy.

In a second method, a process gas having known or unknown composition is supplied to the inlet 104. The system controller 300 transmits a command to flow gas to both of the outlets 110, 111. In response, the proportional valve 120 and the on/off valves 150, 151 open and the process gas flows out of both outlets 110, 111. The flow rate may be adjusted by altering the position of the proportional valve 120. In the event that the process gas is known, one of the outlets 110, 111 may be driven to a specific mass flow rate based on a calibrated gas map. In the event that the process gas is unknown, an estimated gas map may be used to drive the mass flow rate through one of the outlets 110, 111. The flows from the outlets 110, 111 may be halted by closing one or more of the on/off valves 150, 151.

In a third method, a process gas of known or unknown composition is supplied to the inlet 104. The system controller 300 transmits a command to transition the first on/off valve 150 to the fully open state and the second on/off valve 151 to the fully closed state. A controlled flow of process gas is delivered to the first gas outlet 110 and no gas is delivered to the second gas outlet 111. Subsequently, the system controller 300 transmits a command to transition the first on/off valve 150 to the fully closed state and the second on/off valve 151 to the fully open state. This results in the delivery of a controlled flow of process gas to the second gas outlet 111 while no gas is delivered to the first gas outlet 110. Subsequently, the system controller 300 transmits a command to transition both the first and second on/off valves 150, 151 to the fully open state. First and second controlled flows of process gas are delivered to the first and second gas outlets 110, 111. In other embodiments of this method, the sequence is altered such that the second on/off valve 151 is opened before the first on/off valve 150 or the first or second on/off valves 150, 151 are closed to transition from delivering process gas to the first and second gas outlets 110, 111 to delivering process gas to only one of the first and second gas outlets 110, 111. In yet other embodiments, a proportional valve 121 may be substituted for one or both of the first and second on/off valves 150, 151 and may be operated at a state intermediate between the fully open and fully closed states. In yet other embodiments, a second proportional valve 121 may be introduced upstream of either one of the first and second flow restrictors 160, 161.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A gas flow control system for delivering a plurality of gas flows, the gas flow control system comprising:
    a gas flow path extending from a gas inlet to a first gas outlet and a second gas outlet;
    a first on/off valve operably coupled to the gas flow path and located between the gas inlet and the first gas outlet;
    a second on/off valve operably coupled to the gas flow path and located between the gas inlet and the second gas outlet;
    a first flow restrictor having a first flow impedance operably coupled to the gas flow path and located between the gas inlet and the first gas outlet;
    a second flow restrictor having a second flow impedance operably coupled to the gas flow path and located between the gas inlet and the second gas outlet;

wherein, when both the first and second on/off valves are in a fully open state, a ratio between a first gas flow from the first gas outlet and a second gas flow from the second gas outlet is determined by a ratio of the first flow impedance and the second flow impedance.

2. The system of claim 1 further comprising a proportional valve operably coupled to the gas flow path upstream of the first and second on/off valves and downstream of the gas inlet.

3. The system of claim 1 further comprising a controller having a memory, the memory storing a value representing the first flow impedance or the second flow impedance.

4. The system of claim 1 further comprising a pressure transducer operably coupled to the gas flow path between the gas inlet and the first and second flow restrictors.

5. The system of claim 1 further comprising a base, the first on/off valve, the second on/off valve, the first flow restrictor, and the second flow restrictor all mounted to the base.

6. The system of claim 1 wherein the gas flow path comprises a third gas outlet and the gas flow control system further comprises a third valve operably coupled to the gas flow path and located between the gas inlet and the third gas outlet.

7. The system of claim 6 wherein the third valve is a proportional valve.

8. The system of claim 6 wherein the third valve is an on/off valve.

9. A gas flow control system for delivering a plurality of gas flows, the gas flow control system comprising:
   a gas flow path extending from a gas inlet to a first gas outlet and a second gas outlet;
   a first valve operably coupled to the gas flow path and located between the gas inlet and the first gas outlet;
   a second valve operably coupled to the gas flow path and located between the gas inlet and the second gas outlet;
   a first flow restrictor having a first flow impedance operably coupled to the gas flow path and located between the gas inlet and the first gas outlet;
   a second flow restrictor having a second flow impedance operably coupled to the gas flow path and located between the gas inlet and the second gas outlet.

10. The system of claim 9 wherein the first valve is a proportional valve and the second valve is an on/off valve.

11. The system of claim 9 wherein the first and second valves are on/off valves.

12. The system of claim 9 wherein the first and second valves are proportional valves.

13. The gas flow control system of claim 9 further comprising a proportional valve operably coupled to the gas flow path, the proportional valve located upstream of the first and second valves.

14. The gas flow control system of claim 9 wherein, when the first and second valves are in a fully open state, a ratio between a first gas flow from the first gas outlet and a second gas flow from the second gas outlet is determined by a ratio of the first flow impedance and the second flow impedance.

15. The gas flow control system of claim 9 further comprising a base, the first valve, the second valve, the first flow restrictor, and the second flow restrictor all mounted to the base.

16. The gas flow control system of claim 9 further comprising a pressure transducer operably coupled to the gas flow path upstream of the first and second valves and the first and second flow restrictors.

17. A method of delivering a process gas, the method comprising:
   (a) providing a gas flow apparatus having a gas flow path extending from a gas inlet to a first gas outlet and a second gas outlet, a first valve operably coupled to the gas flow path and located between the gas inlet and the first gas outlet, a second valve operably coupled to the gas flow path and located between the gas inlet and the second gas outlet, a first flow restrictor having a first flow impedance operably coupled to the gas flow path and located between the gas inlet and the first gas outlet, and a second flow restrictor having a second flow impedance operably coupled to the gas flow path and located between the gas inlet and the second gas outlet;
   (b) transitioning the first valve to a fully open state and the second valve to a fully closed state and delivering a first controlled flow of process gas to the first gas outlet;
   (c) subsequent to step (b), transitioning the second valve to a fully open state and the first valve to a fully closed state and delivering a second controlled flow of process gas to the second gas outlet; and
   (d) subsequent to step (c), transitioning the first valve to a fully open state and delivering the first controlled flow of process gas to the first gas outlet simultaneously with delivering the second controlled flow of process gas to the second gas outlet.

18. The method of claim 17 wherein the first and second controlled flows of process gas are delivered at a ratio determined by the ratio of the first flow impedance to the second flow impedance.

19. The method of claim 17 wherein the gas flow apparatus further comprises a proportional valve operably coupled to the gas flow path, the proportional valve located upstream of the first and second valves.

20. The method of claim 17 wherein one of the first or second valves are a proportional valve.

* * * * *